United States Patent [19]

English

[11] Patent Number: 4,799,020
[45] Date of Patent: Jan. 17, 1989

[54] TIME VARIANT FREQUENCY CORRECTION TECHNIQUE

[75] Inventor: James D. English, Aloha, Oreg.

[73] Assignee: Tektronix, Inc., Beaverton, Oreg.

[21] Appl. No.: 12,096

[22] Filed: Feb. 6, 1987

[51] Int. Cl.$^4$ ............................................. G01R 23/14
[52] U.S. Cl. ................................. 324/79 R; 324/78 R
[58] Field of Search .................. 324/79 R, 78 R, 77 B, 324/79 D; 328/136; 455/226, 229

[56] References Cited

U.S. PATENT DOCUMENTS

| | | | |
|---|---|---|---|
| 3,913,013 | 10/1975 | Barley et al. | 324/79 R |
| 3,938,048 | 2/1976 | Elliott | 324/79 D |
| 4,137,497 | 1/1979 | Lowenschuss | 324/79 D |

Primary Examiner—Stewart J. Levy
Assistant Examiner—Louis M. Arana
Attorney, Agent, or Firm—Francis I. Gray

[57] ABSTRACT

A time variant frequency correction technique uses a frequency conversion circuit to obtain an intermediate frequency and an adjusted local oscillator frequency from an input signal frequency, a local oscillator frequency and a reference oscillator frequency. The intermediate frequency and adjusted local oscillator frequency are simultaneously counted during a period determined by the reference frequency. The resulting counts are used to calculate the input frequency independent of time variations in the local oscillator frequency for display on a display device.

2 Claims, 3 Drawing Sheets

TIME VARIANT FREQUENCY CORRECTION TECHNIQUE

BACKGROUND OF THE INVENTION

The present invention relates to the measurement of carrier frequencies by frequency counting, and more particularly to a time variant frequency correction technique for measuring carrier frequencies, which technique eliminates uncorrelated errors introduced by variations in a local oscillator.

A spectrum analyzer provides frequency spectrum information in the form of a graph having frequency and amplitude as the axes. The spectrum analyzer displays each frequency component of a signal as an individual vertical deflection. For a continuous wave (CW) signal, such as a sine wave, a single vertical deflection at the appropriate frequency of the sine wave is displayed. More complex signals will display other vertical deflections representing harmonic components, distortion products and the like.

Basically a spectrum analyzer is a tuned receiver coupled to a cathode ray tube display. By sweeping a local oscillator and varying the frequency span, virtually any portion of the frequency range of a particular instrument can be displayed. Also, with selectable intermediate frequency (IF) bandwidths and logarithmic and linear detection, individual signals close together in frequency can be resolved so that simultaneous display of signals at various amplitudes is achieved.

In the past techniques for measurement of carrier frequencies of CW signals have been limited to the direct methods of frequency counting. Recently modern spectrum analyzers have incorporated these traditional techniques to enhance the overall performance of and basic measurement capabilities of these types of instruments. In these applications additional errors are introduced by uncorrelated errors in the local oscillator systems due to periodic or random variations in local oscillator frequencies. As more and more items are counted to derive the final equation for input frequencies, the errors of these sources add and cause an additional error in the final result. Currently this counting of an intermediate frequency and of the local oscillator, the values of which are used by a microprocessor to compute an input frequency, is done sequentially. The errors accumulated due to variations in the local oscillator translate into an error in the value calculated for the input frequency equal to the error accumulated due to variations in the local oscillator during the measurement of the intermediate frequency plus the error accumulated during the measurement of the local oscillator frequency.

What is desired is a time variant frequency correction technique which removes all errors except those due to a reference frequency.

SUMMARY OF THE INVENTION

Accordingly the present invention provides a time variant frequency correction technique which cancels any time variant phenomena occurring on a local oscillator during the measurement of an intermediate frequency and the local oscillator frequency. A dual counter counts an intermediate frequency and the local oscillator frequency simultaneously using a common reference frequency. The result is the cancellation of all errors due to variations in the local oscillator. All other system errors are correlated and are that of the reference frequency.

The objects, advantage and other novel features of the present invention will be apparent from the following detailed description when read in conjunction with the appended claims and attached drawing.

BRIEF DESCRIPTION OF THE INVENTION

DESCRIPTION OF THE PREFERRED EMBODIMENT

Figure 1:
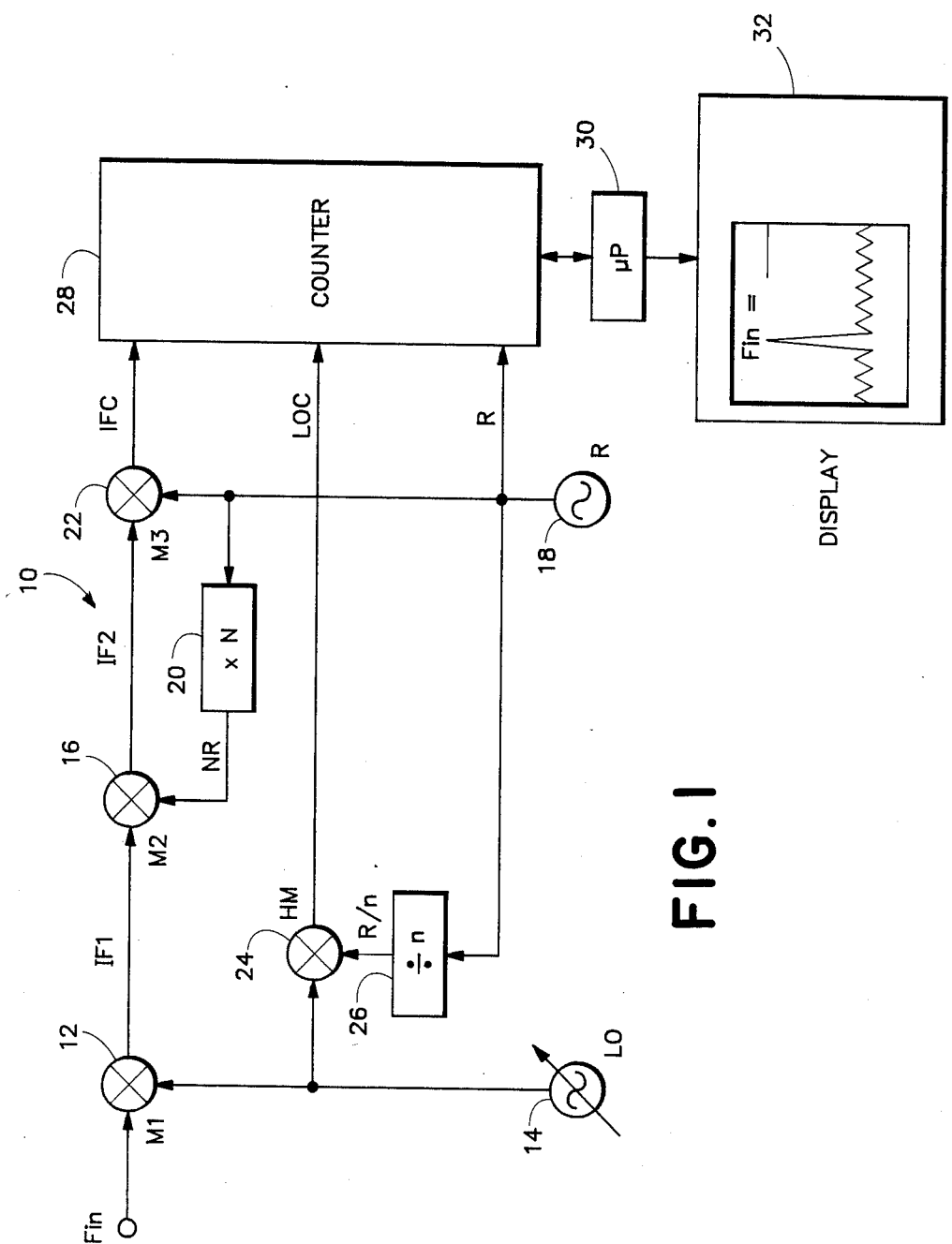
FIG. 1 is a block diagram of a frequency determination circuit incorporating a time variant frequency correction technique according to the present invention.

Referring now to FIG. 1 a typical spectrum analyzer frequency conversion circuit 10 is shown. An unknown input frequency $F_{in}$ is input to a first mixer 12 where it is mixed with a frequency LO from a local oscillator 14, such as a variable YIG oscillator. The sweep of the local oscillator frequency LO across the selected frequency span of the particular spectrum analyzer is stopped at the particular frequency to be determined. This is typically accomplished by centering the analog representation of the frequency of interest on the display. The output of the first mixer 12 is a first intermediate frequency IF1 which is input to a second mixer 16 where it is mixed with an integer multiple of a reference frequency R from a reference oscillator 18. The reference oscillator 18 is very stable, typically a crystal controller oscillator. A multiplier 20, having the reference frequency R as an input, provides the multiple of the reference frequency to the second mixer 16. The output of the second mixer 16 is a second intermediate frequency IF2 which is input to a third mixer 22 where it is mixed directly with the reference frequency R. The output of the third mixer 22 is a third intermediate frequency IFC.

The local oscillator frequency LO is mixed with an integer submultiple of the reference frequency R in a harmonic mixer 24. The submultiple of the reference frequency R is provided by the output of a divider 26 having the reference frequency as an input. The output of the harmonic mixer 24 is an adjusted local oscillator frequency LOC.

The third intermediate frequency IFC, the adjusted local oscillator frequency LOC and the reference frequency R are input to a counter circuit 28. The output of the counter circuit 28 is appropriate counts for the third intermediate frequency IFC, the adjusted local oscillator frequency LOC and the reference frequency R, the respective counts being input to a microprocessor 30. The microprocessor 30 calculates the input frequency $F_{in}$ and causes the result to be displayed on an appropriate display device 32.

The equations representing the various frequencies generated in the frequency conversion circuit 10 are illustrated below:

$$IF1 = LO - F_{in} \qquad (1)$$

$$IF2 = IF1 - NR = LO - F_{in} - NR \qquad (2)$$

$$IFC = IF2 - R = LO - F_{in} - (N+1)R \qquad (3)$$

$$LOC = \pm(LO - MR/n) \qquad (4)$$

where M is a predetermined constant. Since the local oscillator frequency can be either plus or minus with respect to the harmonic of the reference frequency, the local oscillator 10 is perturbed and the appropriate sign determined by observing the adjusted local oscillator frequency LOC. When the sign is minus, $$LOC = MR/n - LO \quad (5)$$
$$F_{in} = K - (IFC + LOC) \quad (6)$$

where $K = \{M/n - (N+1)\}R$ which is a constant; and when the sign is plus, $$LOC = LO - MR/n \quad (7)$$
$$F_{in} = K - (IFC - LOC) \quad (8)$$

Since the local oscillator frequency LO is the same for both LOC and IFC when they are measured simultaneously, the errors in LO are canceled. The only resulting errors are system errors related to the reference frequency R. The result is orders of magnitude increase in the accuracy of the determination of $F_{in}$ due to the orders of magnitude difference in stability between the reference frequency and the local oscillator frequency.

Figure 2:
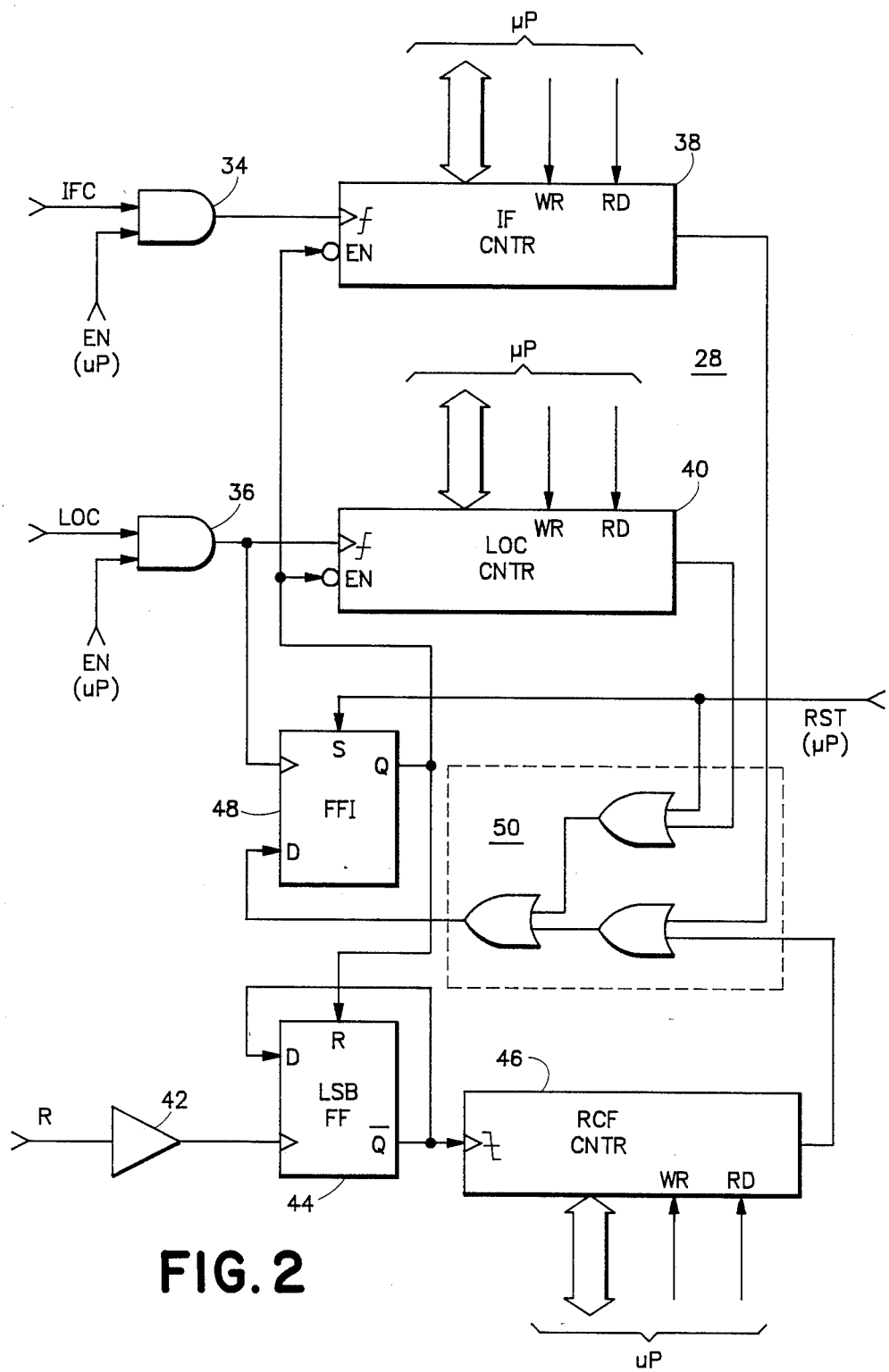
FIG. 2 is a block diagram of the counter of FIG. 1.

Referring now to FIG. 2 one embodiment of the counter circuit 28 is shown. The third intermediate frequency IFC is input to a first gate circuit 34 which, when enabled by a command from the microprocessor 30, acts as a buffer amplifier. Likewise the adjusted local oscillator frequency LOC is input to a second gate circuit 36 which, when enabled by a command from the microprocessor 30, acts as a buffer amplifier. The outputs of the respective gates 34, 36 are input to the clock inputs of respective counters 38, 40. These counters 38, 40, when enabled as will be described subsequently, count the respective clock cycles of IFC and LOC. The reference frequency R is input to a buffer amplifier 42, the output of which is applied to the clock input of a reference flip-flop 44. The /Q output of the reference flip-flop 44 is applied to the clock input of a reference counter 46 as well as being returned to the D input of the reference flip-flop.

A control flip-flop 48 has the output of the second gate 36 applied as a clock input. The set input is connected to a reset signal RST from the microprocessor 30, the reset signal also being input to a control gate circuit 50. Also input to the control gate circuit 50 are signals from the respective counters 38, 40, 46. The output from the control gate circuit 50 is applied to the D input of the control flip-flop 48. The Q output of the control flip-flop 48 is applied to the reset terminal of the reference flip-flop 44 and to the not enable inputs of the respective IFC and LOC counters 38, 40.

In operation the operator centers the analog signal on the display 32 for which the frequency is to be determined. The scanning by the local oscillator 14 is stopped at a frequency corresponding approximately to that of the center of the display 32, and the respective counters 38, 40, 46 are loaded with initial values by the microprocessor 30. The RST signal from the microprocessor 30 holds the control flip-flop 48 in a state such that the Q output is maintained at a logical "1". The Q output prevents the IFC and LOC counters 38, 40 as well as the reference flip-flop 44 from responding to the frequency inputs at the respective clock inputs. To initiate the count process the microprocessor 30 removes the reset signal, i.e., RST goes to a logical "0". The output of the control gate circuit 50 also goes to a logical "0" which is applied to the D input of the control flip-flop 48. When the leading edge of the adjusted local oscillator frequency LOC is applied to the control flip-flop 48 clock input, the Q output switches to a logical "0" to enable the respective IFC and LOC counters 38, 40 and remove the reset from the reference flip-flop 44, effectively enabling the reference counter 46. The value initially loaded into the LOC counter 40 is a function of the desired accuracy, i.e., over how many cycles of the adjusted local oscillator frequency will the counting be performed. The inputs to the control gate circuit 50 from the respective counters 38, 40, 46 maintain the output at a logical "0".

When the desired number of cycles of the adjusted local oscillator frequency LOC have been counted, the output from the LOC counter 40 causes the output of the control gate circuit 50 to switch to a logical "1". With a logical "1" applied to the D input of the control flip-flop 48 the next positive edge of the adjusted local oscillator frequency LOC causes the output Q to become a logical "1", disabling the respective IFC and LOC counters 38, 40, and disabling the reference counter 46 via resetting the reference flip-flop 44. The microprocessor 30 then reads the contents of the three registers 38, 40, 46 and computes the value for $F_{in}$. Based upon the results of the initial determination the local oscillator frequency is adjusted and a new count is initiated by reloading the respective registers 38, 40, 46, the value loaded into the LOC counter 40 being such as to achieve the desired final accuracy. The count process is repeated and a final value for $F_{in}$ is computed and displayed.

Figure 3:
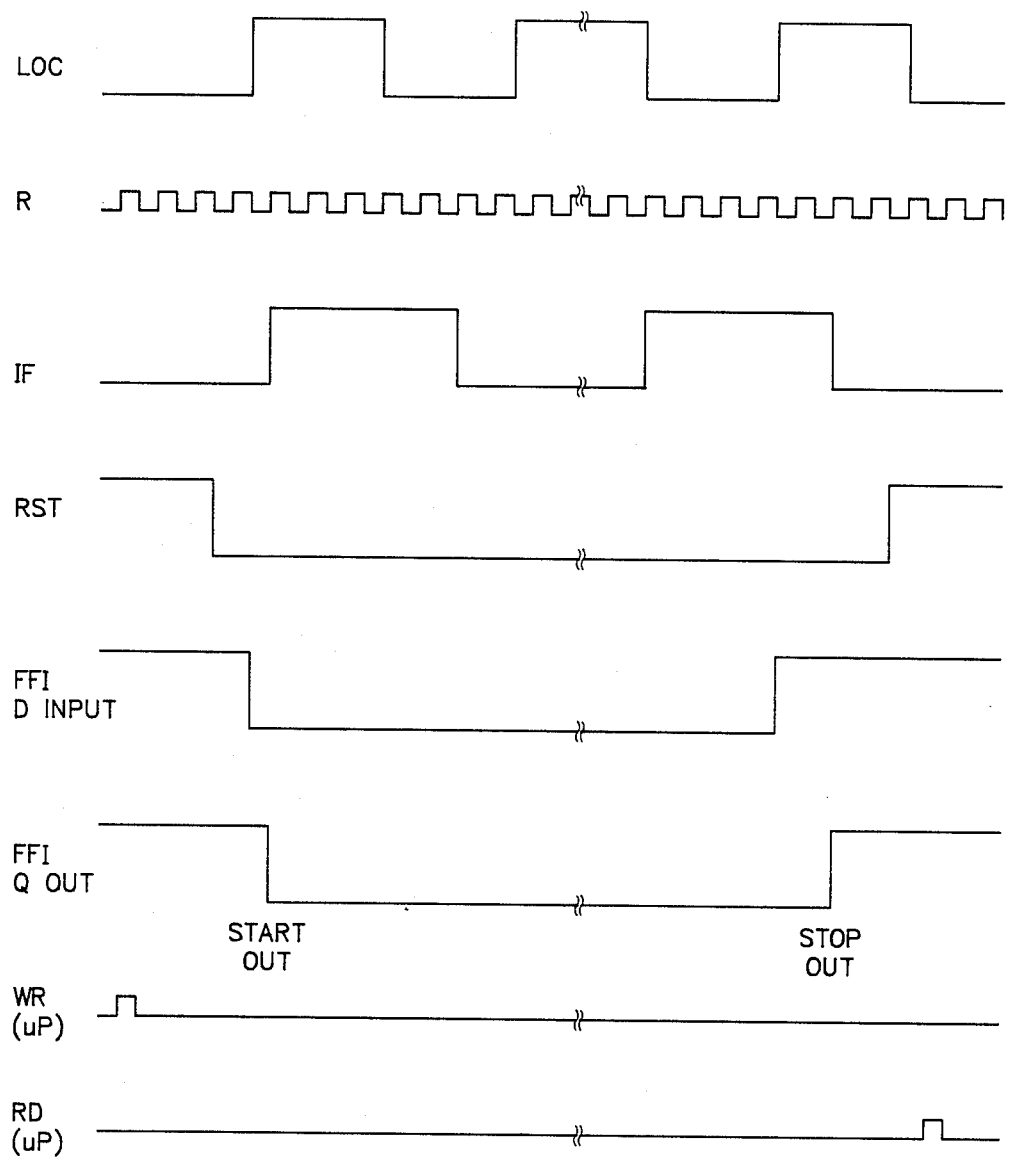
FIG. 3 is a timing diagram for the counter of FIG. 2.

As shown in FIG. 3 prior to the removal of the reset signal RST a write command from the microprocessor 30 is transmitted to preload the counters 38, 40, 46. When the reset signal RST is removed by the microprocessor 30 the output of the control gate circuit 50, after a propagation delay, applies a logical "0" to the D input of the control flip-flop 48. At the first positive transition of the adjusted local oscillator frequency LOC the Q output switches to a logical "0", enabling counting by the respective counters 38, 40, 46. After the requisite number of cycles of LOC have been counted, the output of the control gate circuit 50 switches to a logical "1" and at the next positive transition of LOC the Q output switches to a logical "1", disabling the respective counters 38, 40, 46. The microprocessor 30 then reapplies the reset signal RST and transmits a subsequent read command to read the contents of the counters 38, 40, 46.

Thus the present invention provides a time variant frequency correction technique using a dual counter circuit which counts both an intermediate frequency and a reference frequency simultaneously over a period determined by a local oscillator frequency so that in subsequent calculations based upon these frequencies the effect of the instability of the local oscillator is cancelled, resulting in orders of magnitude increase in the accuracy of the resulting calculations.

What is claimed is:

1. An instrument for measuring the frequency of an input signal, the instrument having a variable local oscillator and a reference oscillator, comprising:
    means for deriving an intermediate frequency from the input signal frequency, the frequency of the local oscillator and the frequency of the reference oscillator;

means for deriving an adjusted local oscillator frequency from the frequency of the local oscillator and the frequency of the reference oscillator; and means gated by the frequency of the reference oscillator for simultaneously counting the intermediate frequency and the adjusted local oscillator frequency, the frequency of the input signal being a function of the intermediate frequency and the adjusted local oscillator frequency.

2. An instrument as recited in claim 1 further comprising;
   means for calculating the frequency of the input signal using the output of the counting means and predetermined constants; and
   means for displaying the results determined by the calculating means.

* * * * *